United States Patent
Sui (10) Patent No.: US 11,360,139 B2
(45) Date of Patent: Jun. 14, 2022

(54) METHOD FOR TESTING A POWER MODULE

(71) Applicant: ZHENGZHOU YUNHAI INFORMATION TECHNOLOGY CO., LTD., Zhengzhou (CN)

(72) Inventor: Xin Sui, Henan (CN)

(73) Assignee: ZHENGZHOU YUNHAI INFORMATION TECHNOLOGY CO., LTD., Zhengzhou (CN)

(*) Notice: Subject to any disclaimer, the term of this patent is extended or adjusted under 35 U.S.C. 154(b) by 0 days.

(21) Appl. No.: 17/273,058

(22) PCT Filed: May 31, 2019

(86) PCT No.: PCT/CN2019/089423
§ 371 (c)(1),
(2) Date: Mar. 3, 2021

(87) PCT Pub. No.: WO2020/048166
PCT Pub. Date: Mar. 12, 2020

(65) Prior Publication Data
US 2021/0325446 A1      Oct. 21, 2021

(30) Foreign Application Priority Data
Sep. 5, 2018 (CN) .......................... 201811030848.3

(51) Int. Cl.
*G01R 31/28* (2006.01)
*G01R 19/00* (2006.01)
*G01R 31/40* (2020.01)

(52) U.S. Cl.
CPC ..... *G01R 31/2813* (2013.01); *G01R 19/0084* (2013.01); *G01R 31/40* (2013.01)

(58) Field of Classification Search
CPC . G01R 31/2813; G01R 19/0084; G01R 31/40
(Continued)

(56) References Cited

U.S. PATENT DOCUMENTS

| 2010/0301886 A1* | 12/2010 | Chin | G01R 31/52 |
| | | | 324/555 |
| 2013/0241584 A1* | 9/2013 | Mao | G06F 11/2284 |
| | | | 324/750.01 |

(Continued)

FOREIGN PATENT DOCUMENTS

| CN | 102880534 A | 1/2013 |
| CN | 103165201 A | 6/2013 |

(Continued)

OTHER PUBLICATIONS

International Search Report of the International Searching Authority for State Intellectual Property Office of the China National Intellectual Property Administration in PCT application No. PCT/CN2019/089423 dated Jul. 19, 2019, which is an international application corresponding to this U.S. application.

(Continued)

*Primary Examiner* — Giovanni Astacio-Oquendo
(74) *Attorney, Agent, or Firm* — Kolitch Romano LLP (57) ABSTRACT

A method for testing a power module includes connecting an output capacitor of the power module to a load meter; inputting an input signal, an enable signal, a PowerGood signal, and an output signal of the power module to first, second, third, and fourth channels of an oscillometer, respectively; adjusting the load meter to a no-load state, and capturing and storing the power-on waveforms and power-off waveforms of four channels of signals of the power module; adjusting the load meter to a full-load state, and capturing and storing the power-on waveforms and power-off waveforms of the four channels of signals of the power module; and determining whether the power-on sequence, power-off sequence, overshoot voltage value, and undershoot voltage value of the power module are normal based on the power-on waveforms and power-off waveforms of the (Continued)

four channels of signals stored by the load meter under the no-load and full-load states.

15 Claims, 3 Drawing Sheets

(58) Field of Classification Search
USPC .......................................... 324/537, 522, 500
See application file for complete search history.

(56) References Cited

U.S. PATENT DOCUMENTS

2016/0146861 A1* 5/2016 Min ..................... G06F 11/2284
　　　　　　　　　　　　　　　　　　　　　　324/96
2021/0389368 A1* 12/2021 Zhang ................ G01R 31/2815

FOREIGN PATENT DOCUMENTS

| CN | 105242218 | A | 1/2016 |
| CN | 106324395 | A | 1/2017 |
| CN | 109116266 | A | 1/2019 |
| TW | 201000933 | A | 1/2010 |

OTHER PUBLICATIONS

The State Intellectual Property Office of People's Republic of China, First Office Action in Patent Application No. 201811030848.3 dated Jul. 18, 2019, which is a foreign counterpart application corresponding to this U.S. Patent Application, to which this application claims priority.

The State Intellectual Property Office of People's Republic of China, Second Office Action in Patent Application No. 201811030848.3 dated Dec. 17, 2019, which is a foreign counterpart application corresponding to this U.S. Patent Application, to which this application claims priority.

* cited by examiner

METHOD FOR TESTING A POWER MODULE

This application is a national stage of an international application No. PCT/CN2019/089423, filed on May 31, 2019, and entitled "Method for Testing A Power Module." The international application claims the benefit of priority from CN Application No. 201811030848.3, filed on Sep. 5, 2018, titled "method for testing a power module", Both applications are incorporated herein by reference in their entirety.

TECHNICAL FIELD

The present application relates to power supply testing field, and more particularly, relates to a method for testing a power module.

BACKGROUND

Power module (Voltage regulator, VR) of motherboards and other boards of electronic devices (e.g., computers and servers) need to be tested during development phase. The test for the power module mainly includes sequence test, voltage overshoot test and voltage undershoot test.

At present, the sequence test, voltage overshoot test, and voltage undershoot test for the power module are performed separately, so that the entire test process is relatively complicated and the test efficiency is low.

SUMMARY

Against this background, the object underlying the present application is to provide a method for testing a power module, which could be able to improve the test efficiency of sequence test, voltage overshoot test and voltage undershoot test for the power module.

The present application, in order to achieve the purpose above, provides technical solution as following:

A method for testing a power module, the power module is located in a testing motherboard, wherein the method for testing includes:

connecting both ends of an output capacitor of the power module to a load meter, respectively;

inputting an input signal of the power module to a first channel of an oscillometer, inputting an enable signal of the power module to a second channel of the oscillometer, inputting a PowerGood signal of the power module to a third channel of the oscillometer, and inputting an output signal of the power module to a fourth channel of the oscillometer;

setting testing items of the first, second and third channel of the oscillometer as Max, and setting testing items of the fourth channel of the oscillometer as Max/Min/Pk-Pk/Rise/Fall;

controlling the load meter to be powered on and setting the load meter to a static load mode;

adjusting the load meter to a no-load state, adjusting the oscillometer to be triggered by rising edges of an EN signal, controlling the testing motherboard to be powered on, capturing and storing power-on waveforms of the input signal, the enable signal, the PowerGood signal and the output signal of the power module, adjusting the oscillometer to be triggered by falling edges of the EN signal, controlling the testing motherboard to be powered off, and capturing and storing power-off waveforms of the input signal, the enable signal, the PowerGood signal and the output signal of the power module;

determining whether the power-on sequence and power-off sequence of the power module are normal or not and determining whether the overshoot voltage value and undershoot voltage value of the power module are normal or not based on the power-on waveforms and the power-off waveforms of the four channels of signals of the power module stored by the load meter under the no-load state;

adjusting the load meter to a full-load state, adjusting the oscillometer to be triggered by the rising edges of the EN signal, controlling the testing motherboard to be powered on, capturing and storing power-on waveforms of the input signal, the enable signal, the PowerGood signal and the output signal of the power module, adjusting the oscillometer to be triggered by the falling edges of the EN signal, controlling the testing motherboard to be powered off, and capturing and storing power-off waveforms of the input signal, the enable signal, the PowerGood signal and the output signal of the power module; and determining whether the power-on sequence and power-off sequence of the power module are normal or not and determining whether the overshoot voltage value and undershoot voltage value of the power module are normal or not based on the power-on waveforms and the power-off waveforms of the four channels of signals of the power module stored by the load meter under the full-load state.

Optionally, the method for testing based on disclosed above further includes:

adjusting the load meter to a half-load state, adjusting the oscillometer to be triggered by the rising edges of the EN signal, controlling the testing motherboard to be powered on, capturing and storing power-on waveforms of the input signal, the enable signal, the PowerGood signal and the output signal of the power module, adjusting the oscillometer to be triggered by the falling edges of the EN signal, controlling the testing motherboard to be powered off, and capturing and storing power-off waveforms of the input signal, the enable signal, the PowerGood signal and the output signal of the power module; and determining whether the power-on sequence and power-off sequence of the power module are normal or not and determining whether the overshoot voltage value and undershoot voltage value of the power module are normal or not based on the power-on waveforms and the power-off waveforms of the four channels of signals of the power module stored by the load meter under the half-loading state.

Optionally, the method for testing based on disclosed above further includes:

determining whether the rising time and falling time of the output signal of the power module meet preset requirements or not based on the power-on waveforms and the power-off waveforms of the output signal of the power module stored by the load meter under the no-load state;

and/or, determining whether the rising time and the falling time of the output signal of the power module meet preset requirements based on the power-on waveforms and the power-off waveforms of the output signal of the power module stored by the load meter under the full-load state;

and/or, determining whether the rising time and the falling time of the output signal of the power module meet preset requirements based on the power-on waveforms and the power-off waveforms of the output signal of the power module stored by the load meter under the half-loading state.

Optionally, in the method for testing disclosed above, inputting an input signal of the power module to a first channel of an oscillometer, inputting an enable signal of the power module to a second channel of the oscillometer, inputting a PowerGood signal of the power module to a third channel of the oscillometer, and inputting an output signal of the power module to a fourth channel of the oscillometer further includes:

connecting the input end of the power module to the first channel of the oscillometer through a single-ended probe;

connecting the enable signal end of the power module to the second channel of the oscillometer through a single-ended probe;

connecting the PowerGood signal end of the power module to the third channel of the oscillometer through a single-ended probe; and connecting the output end of the power module to the fourth channel of the oscillometer through a single-ended probe.

Optionally, in the method for testing disclosed above, inputting an input signal of the power module to a first channel of an oscillometer, inputting an enable signal of the power module to a second channel of the oscillometer, inputting a PowerGood signal of the power module to a third channel of the oscillometer, and inputting an output signal of the power module to a fourth channel of the oscillometer further includes:

connecting the input end of the power module to the first channel of the oscillometer through a single-ended probe;

connecting the enable signal end of the power module to the second channel of the oscillometer through a single-ended probe;

connecting the PowerGood signal end of the power module to the third channel of the oscillometer through a single-ended probe; and connecting one end of the output capacitor of the power module to a positive input end of a differential probe, connecting the other end of the output capacitor of the power module to a negative input end of the differential probe, and connecting the output end of the differential probe to the fourth channel of the oscillometer.

The beneficial effects of the testing method disclosed in the present application at least includes the following:

The method for testing a power module disclosed in the present application merges the sequence test, voltage overshoot test and voltage undershoot test for the power module, so that testers could complete the sequence test, voltage overshoot test and voltage undershoot test for the power module by performing only one wiring operation, which simplifies the testers' operation and improves test efficiency.

BRIEF DESCRIPTION OF THE DRAWINGS

In order to explain the technical solutions in embodiments of the present application or prior art more clearly, a brief introduction as below is shown for drawings which are mentioned in the description of the embodiments or prior art. Obviously, the drawings shown below are some embodiments of the present application, and other drawings can be obtained by those of ordinary skill in the art based on these drawings without any creative work.

DETAILED DESCRIPTION

The present application discloses a method for testing a power module which is located in a testing motherboard, i.e., the power module is a part of the testing motherboard. Wherein, the testing motherboard could be a motherboard or other boards of electronic devices. The test efficiency of the sequence test, voltage overshoot test and voltage undershoot test for the power module can be improved by performing the method for testing disclosed by the present application.

In order to make the purpose, technical solutions and advantages of the embodiments of the present application clearer, the technical solutions in the embodiments of the present application will be described clearly and completely in conjunction with the drawings in the embodiments of the present application. Obviously, the described embodiments should be just a part, not all of the embodiments of the present application. All the other embodiments that could be obtained by those of ordinary skill in the art without any creative work based on the embodiments in the present application are all within the scope of the present application.

An explanation of the English abbreviations appearing in the present application is shown as following:

VR: Power module or voltage regulator;

VIN: the input signal of the power module;

ENABLE, EN signal: the enable signal of the power module;

PowerGood: Power good signal of the power module;

VOUT: The output signal of the power module.

Figure 1:
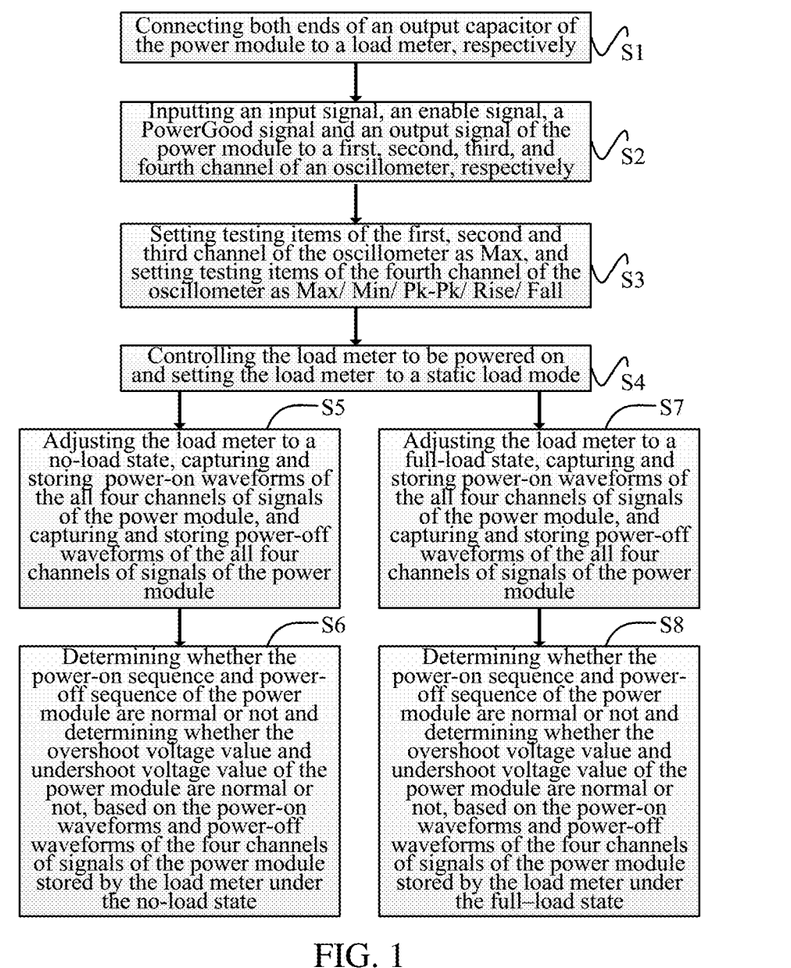
FIG. 1 is a flowchart of a method for testing a power module according to one embodiment of the present application.

Now referring to FIG. 1 which is a flowchart of a method for testing a power module disclosed by the present application, the method for testing includes:

Step S1: Connecting both ends of an output capacitor of the power module to a load meter, respectively.

The load meter is used to apply a specified load on both ends of the output capacitor of the power module. In an embodiment, load wires can be drawn from both ends of the output capacitor respectively, wherein one of the load wires is connected to one output terminal of the load meter, while the other one of the load wires is connected to the other one output terminal of the load meter.

Step S2: Inputting an input signal VIN of the power module to a first channel of an oscillometer, inputting an enable signal ENABLE of the power module to a second channel of the oscillometer, inputting a PowerGood signal of the power module to a third channel of the oscillometer, and inputting an output signal VOUT of the power module to a fourth channel of the oscillometer.

Step S3: Setting testing items of the first, second and third channel of the oscillometer as Max, and setting testing items of the fourth channel of the oscillometer as Max/Min/Pk-Pk/Rise/Fall.

Step S4: Controlling the load meter to be powered on and setting the load meter to a static load mode.

Step S5: Adjusting the load meter to a no-load state, adjusting the oscillometer to be triggered by rising edges of an EN signal, controlling the testing motherboard to be powered on, capturing and storing power-on waveforms of the input signal, the enable signal, the PowerGood signal and the output signal of the power module, adjusting the oscillometer to be triggered by falling edges of the EN signal, controlling the testing motherboard to be powered off, and capturing and storing power-off waveforms of the input signal, the enable signal, the PowerGood signal and the output signal of the power module.

Step S6: Determining whether the power-on sequence and power-off sequence of the power module are normal or not and determining whether the overshoot voltage value and undershoot voltage value of the power module are normal or not, based on the power-on waveforms and power-off waveforms of the four channels of signals of the power module stored by the power module under the no-load state.

As an embodiment, if the overshoot voltage value of the power module is less than 1.05*the measured voltage of the power module (1.05 times the measured voltage of the power module), the overshoot voltage value of the power module is considered to be normal; and if the undershoot voltage value of the power module is less than 300 mV, the undershoot voltage value of the power module is considered to be normal.

In addition, whether the power-on waveforms of the four channels of signals of the power module stored under the no-load state before and after its rising are monotonously smooth or not, show abnormal oscillations, back grooves and steps or not can also be examined and whether the power-off waveforms of the four channels of signals of the power module stored under the no-load state before and after its falling are monotonously smooth or not, show abnormal oscillations, back grooves and steps or not can also be examined.

Step S7: Adjusting the load meter to a full-load state, adjusting the oscillometer to be triggered by the rising edges of the EN signal, controlling the testing motherboard to be powered on, capturing and storing power-on waveforms of the input signal, the enable signal, the PowerGood signal and the output signal of the power module, adjusting the oscillometer to be triggered by the falling edges of the EN signal, controlling the testing motherboard to be powered off, and capturing and storing power-off waveforms of the input signal, the enable signal, the PowerGood signal and the output signal of the power module;

Step S8: Determining whether the power-on sequence and power-off sequence of the power module are normal or not and determining whether the overshoot voltage value and undershoot voltage value of the power module are normal or not, based on the power-on waveforms and power-off waveforms of the four channels of signals of the power module stored by the load meter under the full-load state.

As an embodiment, if the overshoot voltage value of the power module is less than 1.05*the measured voltage of the power module (1.05 times the measured voltage of the power module), the overshoot voltage value of the power module is considered to be normal; and if the undershoot voltage value of VR is less than 300 mV, the undershoot voltage value of VR is considered to be normal.

In addition, whether the power-on waveforms of the four channels of signals of the power module stored by the load meter under the full-load state before and after its rising are monotonously smooth or not, show abnormal oscillations, back grooves and steps or not can also be examined, and whether the power-off waveforms of the four channels of signals of the power module stored by the load meter under the full-load state before and after its falling are monotonously smooth or not, show abnormal oscillations, back grooves and steps or not can also be examined.

Figure 3:
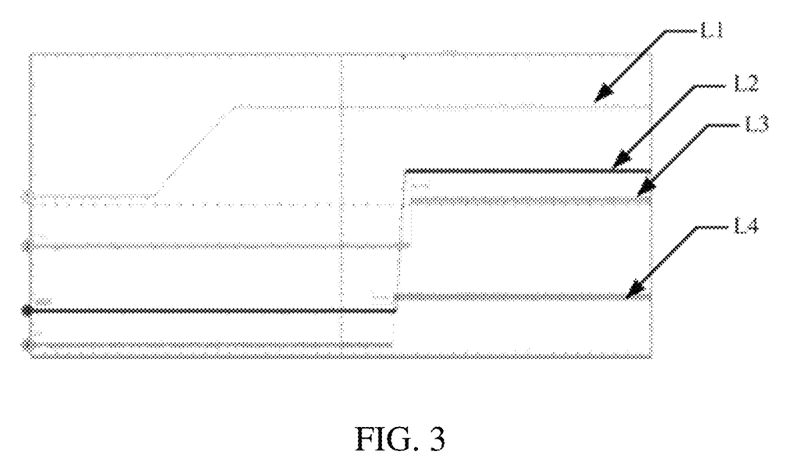
FIG. 3 is the power-on waveforms of all four channels of signal of the power module when the load meter is in a full-load state.
Figure 4:
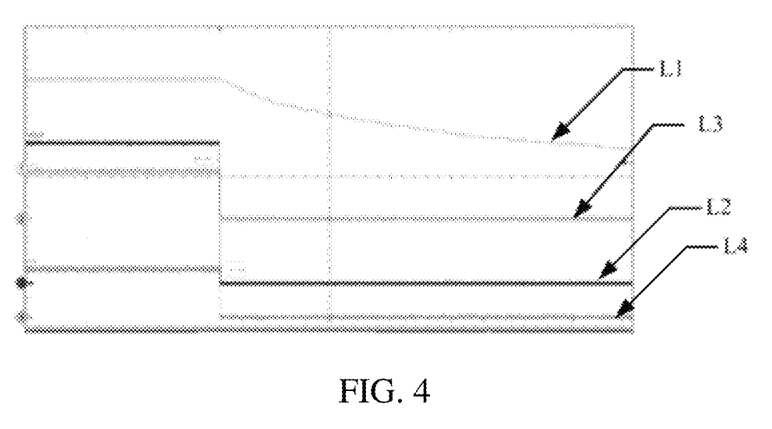
FIG. 4 is the power-off waveforms of all four channels of signal of the power module when the load meter is in the full-load state.

FIG. 3 shows the power-on waveforms of the four channels of signals of the power module when the load meter is under the full-load state, and FIG. 4 shows the power-off waveforms of the four channels of signals of the power module when the load meter is under the full-load state. Wherein, in FIG. 3 and FIG. 4, curve L1 is the waveform of the input signal VIN of the power module, curve L2 is the waveform of the output signal VOUT of the power module, curve L3 is the waveform of the PowerGood signal of the power module, and curve L4 is the waveform of the enable signal ENABLE of the power module.

The method for testing a power module disclosed in the present application merges the sequence test, voltage overshoot test and voltage undershoot test for the power module, so that testers could complete the sequence test, voltage overshoot test and voltage undershoot test for the power module by performing only one wiring operation, which simplifies the testers' operation and improves test efficiency.

Optionally, the method for testing shown in FIG. 1 of the present application may comprise steps S9 and S10. See FIG. 2 for more details.

Figure 2:
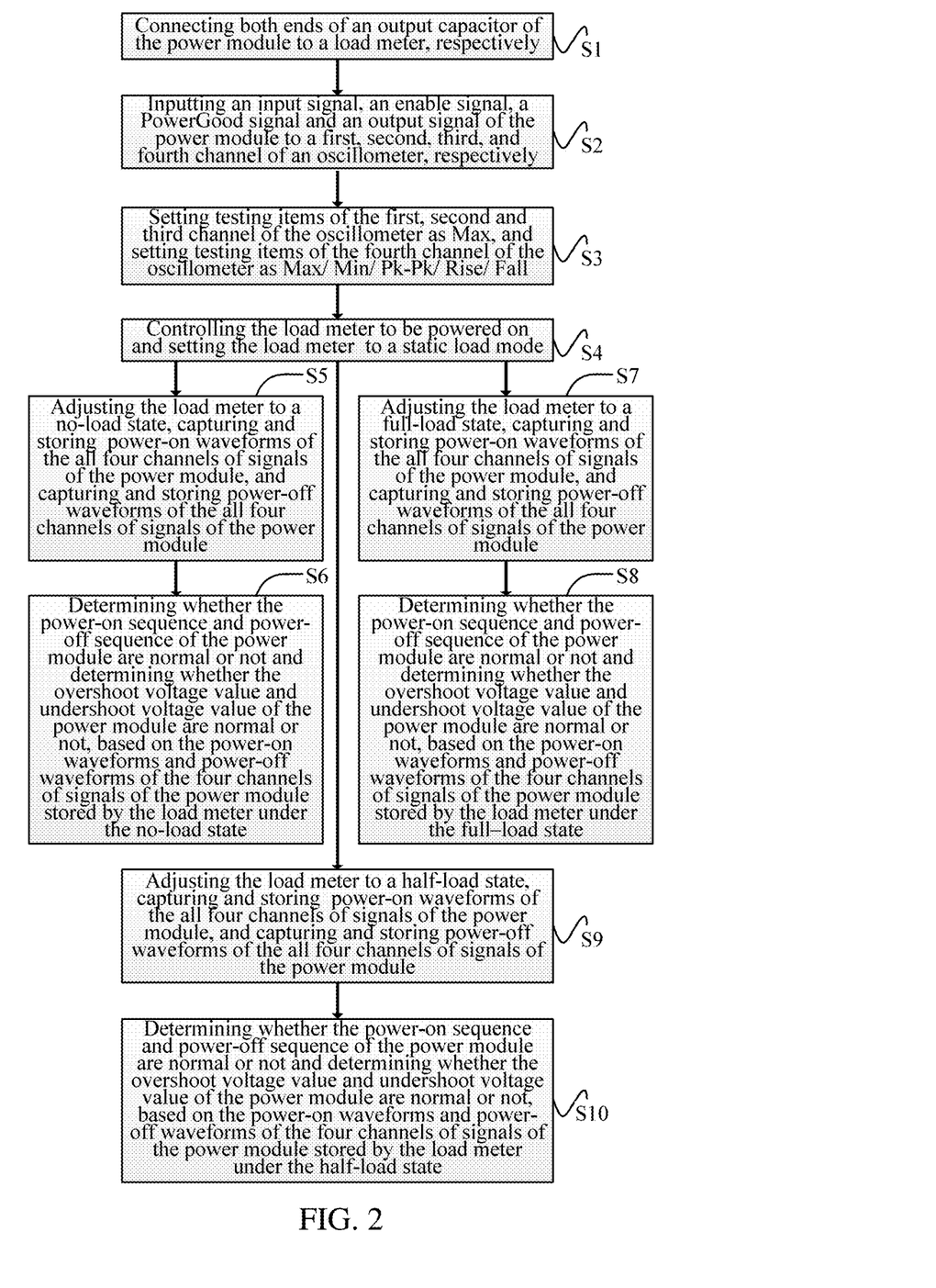
FIG. 2 is a flowchart of a method for testing a power module according to another embodiment of the present application.

Step S9: Adjusting the load meter to a half-load state, adjusting the oscillometer to be triggered by the rising edges of the EN signal, controlling the testing motherboard to be powered on, capturing and storing power-on waveforms of the input signal, the enable signal, the PowerGood signal of the power module and the output signal of the power module, adjusting the oscillometer to be triggered by the falling edges of the EN signal, controlling the testing motherboard to be powered off, and capturing and storing power-off waveforms of the input signal, the enable signal, the PowerGood signal and the output signal of the power module.

Step S10: Determining whether the power-on sequence and power-off sequence of VR are normal or not and determining whether the overshoot voltage value and undershoot voltage value of the power module are normal or not, based on the power-on waveforms and power-off waveforms of the four channels of signals of the power module stored by the load meter under the half-loading state.

"The load meter under the half-loading state" means that the load meter is set to carry 50% of the full-load.

As an embodiment, if the overshoot voltage value of the power module is less than 1.05*the measured voltage of the power module (1.05 times the measured voltage of the power module), the overshoot voltage value of the power module is considered to be normal; and if the undershoot voltage value of the power module is less than 300 mV, the undershoot voltage value of the power module is considered to be normal.

In addition, whether the power-on waveforms of the four channels of signals of the power module stored by the load meter under the half-loading state before and after its rising are monotonously smooth or not, show abnormal oscillations, back grooves and steps or not can also be examined, and whether the power-off waveforms of the four channels of signals of the power module stored by the load meter under the half-loading state before and after its falling are monotonously smooth or not, show abnormal oscillations, back grooves and steps or not could also be examined.

The method for testing a power module shown in FIG. 2 of the present application merges the sequence test, voltage overshoot test and voltage undershoot test for the power module, so that testers can complete the sequence test, voltage overshoot test and voltage undershoot test for the power module by performing only one wiring operation, which simplifies the testers' operation and improves test efficiency.

The method for testing shown in FIG. 1 and FIG. 2 of the present application can further comprises the following additional steps:

determining whether the rising time and falling time of the output signal of the power module meet preset requirements, based on the power-on waveforms and power-off waveforms of the output signal of the power module stored by the load meter under the no-load state;

and/or, determining whether the rising time and falling time of the output signal of the power module meet preset requirements, based on the power-on waveforms and power-off waveforms of the output signal of the power module stored by the load meter under the full-load state;

and/or, determining whether the rising time and falling time of the output signal of the power module meet preset requirements, based on the power-on waveforms and power-off waveforms of the output signal of the power module stored by the load meter under the half-loading state.

During implementation, the rising time of the output signal of the power module is compared with preset rising time threshold to determine whether the rising time of the output signal of the power module meets the preset requirements or not, and the falling time of the output signal of the power module is compared with preset falling time threshold to determine whether the falling time of the output signal of the power module meets the preset requirements or not That is to say, a more comprehensive test for the power module could be performed by judging whether the rising time and the falling time of the output signal of the power module meet the preset requirements or not according to the power-on waveforms and power-off waveforms of the output signals of the power module under the no-load state, full-load state and/or half-loading state.

As an embodiment, in the method for testing disclosed in the present application above, in step S2, inputting an input signal of the power module to the first channel of the oscillometer, inputting an enable signal ENABLE of the power module to the second channel of the oscillometer, inputting a PowerGood signal of the power module to the third channel of the oscillometer, and inputting an output signal of VR to the fourth channels of channel of the oscillometer further includes:

connecting the input end of the power module to the first channel of the oscillometer through a first single-ended probe;

connecting the enable signal end of the power module to the second channel of the oscillometer through a second single-ended probe;

connecting the PowerGood signal end of the power module to the third channel of the oscillometer through a third single-ended probe;

connecting the output end of the power module to the fourth channel of the oscillometer through a fourth single-ended probe.

During implementation, a jump wire is welded to the input end of the power module, the jump wire is connected to the input end of a single-ended probe, and the output end of the single-ended probe is connected to the first channel of the oscillometer, so that the input end of the power module is connected to the first channel of the oscillometer. Another jump wire is welded to the enable signal end of the power module, the jump wire is connected to the input end of another single-ended probe, and the output end of the single-ended probe is connected to the second channel of the oscillometer, so that the enable signal end of VR is connected to the second channel of the oscillometer. Another jump wire is welded to the PowerGood signal end of the power module, the jump wire is connected to the input end of another single-ended probe, and the output end of the single-ended probe is connected to the third channel of the oscillometer, so that the PowerGood signal end of the power module is connected to the third channel of the oscillometer. Another jump wire is welded to the output end of the power module, the jump wire is connected to the input end of another single-ended probe, and the output end of the single-ended probe is connected to the fourth channel of the oscillometer, so that the output end of the power module is connected to the fourth channel of the oscillometer.

As an embodiment, in the method for testing disclosed in the present application above, in step S2, inputting an input signal of the power module to the first channel of the oscillometer, inputting an enable signal of the power module to the second channel of the oscillometer, inputting a PowerGood signal of the power module to the third channel of the oscillometer, and inputting an output signal of the power module to the fourth channel of the oscillometer further includes:

connecting the input end of the power module to the first channel of the oscillometer through a first single-ended probe;

connecting the enable signal end of the power module to the second channel of the oscillometer through a second single-ended probe;

connecting the PowerGood signal end of the power module to the third channel of the oscillometer through a third single-ended probe;

connecting one end of the output capacitor of the power module to positive input end of a differential probe, connecting the other end of the output capacitor of the power module to negative input end of the differential probe, and connecting the output end of the differential probe to the fourth channel of the oscillometer.

Compared with capturing the output signal of the power module by a single-ended probe, the output signal can be captured with higher precision by the differential probe, and the rising time and the falling time of the output signal of the power module can accordingly be determined more accurately, so that whether the rising time and the falling time of the output signal of the power module meet the preset requirements or not can be determined more accurately.

According to one aspect of the present application, a method for testing a power module is provided. The method comprises connecting both ends of an output capacitor of the power module to a load meter, respectively;

inputting an input signal of the power module to a first channel of an oscillometer, inputting an enable signal of the power module to a second channel of the oscillometer, inputting a PowerGood signal of the power module to a third channel of the oscillometer, and inputting an output signal of the power module to a fourth channel of the oscillometer;

setting testing items of the first, second and third channels of the oscillometer as Max, and setting testing items of the fourth channel of the oscillometer as Max/Min/Pk-Pk/Rise/Fall;

controlling the load meter to be powered on and setting the load meter to a static load mode;

adjusting the load meter to a no-load state, adjusting the oscillometer to be triggered by rising edges of an EN signal, controlling the testing motherboard to be powered on, capturing and storing power-on waveforms of the input signal, the enable signal, the PowerGood signal and the output signal of the power module at the no-load state, adjusting the oscillometer to be triggered by falling edges of the EN signal, controlling the testing motherboard to be powered off, and capturing and storing power-off waveforms of the input signal, the enable signal, the PowerGood signal and the output signal of the power module at the no-load state;

determining whether a power-on sequence and a power-off sequence of the power module are normal and determining whether an overshoot voltage value and an undershoot voltage value of the power module are normal based on the power-on waveforms and the power-off waveforms of the four channels of signals of the power module stored by the load meter under the no-load state.

In one embodiment, the method further comprising:

adjusting the load meter to a full-load state, adjusting the oscillometer to be triggered by the rising edges of the EN signal, controlling the testing motherboard to be powered on, capturing and storing power-on waveforms of the input signal, the enable signal, the PowerGood signal and the output signal of the power module at the full-load state, adjusting the oscillometer to be triggered by the falling edges of the EN signal, controlling the testing motherboard to be powered off, and capturing and storing power-off waveforms of the input signal, the enable signal, the PowerGood signal and the output signal of the power module at the full-load state; and determining whether the power-on sequence and power-off sequence of the power module are normal and determining whether the overshoot voltage value and undershoot voltage value of the power module are normal based on the power-on waveforms and the power-off waveforms of the four channels of signals of the power module stored by the load meter under the full-load state.

In one embodiment, the method further comprising: determining whether a rising time and a falling time of the output signal of the power module meet preset requirements based on the power-on waveforms and the power-off waveforms of the output signal of the power module stored by the load meter under the no-load state.

In one embodiment, the method further comprising: determining whether a rising time and a falling time of the output signal of the power module meet preset requirements based on the power-on waveforms and the power-off waveforms of the output signal of the power module stored by the load meter under the full-load state.

In one embodiment, the method further comprising:

a rising time and a falling time of the output signal of the power module with a preset rising time threshold to determine whether the rising time of the output signal of the power module meets the preset requirements under the no-load state;

comparing a falling time of the output signal of the power module with a preset falling time threshold to determine whether the falling time of the output signal of the power module meets the preset requirements at the no-load state;

a rising time and a falling time of the output signal of the power module with a preset rising time threshold to determine whether the rising time of the output signal of the power module meets the preset requirements under the full-load state; and comparing a falling time of the output signal of the power module with a preset falling time threshold to determine whether the falling time of the output signal of the power module meets the preset requirements at the full-load state.

In one embodiment, the method further comprising: adjusting the load meter to a half-load state, adjusting the oscillometer to be triggered by the rising edges of the EN signal, controlling the testing motherboard to be powered on, capturing and storing power-on waveforms of the input signal, the enable signal, the PowerGood signal and the output signal of the power module at the half-load state, adjusting the oscillometer to be triggered by the falling edges of the EN signal, controlling the testing motherboard to be powered off, and capturing and storing power-off waveforms of the input signal, the enable signal, the PowerGood signal and the output signal of the power module at the half-load state.

In one embodiment, the method further comprising:

determining whether a rising time and a falling time of the output signal of the power module meet preset requirements based on the power-on waveforms and the power-off waveforms of the output signal of the power module stored by the load meter under the half load state.

determining whether a power-on sequence and a power-off sequence of the power module are normal and determining whether the overshoot voltage value and undershoot voltage value of the power module are normal based on the power-on waveforms and the power-off waveforms of the four channels of signals of the power module stored by the load meter under the half-load state.

According to one aspect, a method for testing a power module is provided. The power module is located on a testing motherboard. The method comprising:

connecting both ends of an output capacitor of the power module to a load meter, respectively;

inputting an input signal of the power module to a first channel of an oscillometer, inputting an enable signal of the power module to a second channel of the oscillometer, inputting a PowerGood signal of the power module to a third channel of the oscillometer, and inputting an output signal of the power module to a fourth channel of the oscillometer;

adjusting the load meter to a no-load state, capturing and storing power-on waveforms of the input signal, the enable signal, the PowerGood signal and the output signal of the power module at the no-load state;

adjusting the load meter to a full-load state, capturing and storing power-on waveforms of the input signal, the enable signal, the PowerGood signal and the output signal of the power module at the full-load state; and determining whether a power-on sequence and a power-off sequence of the power module are normal an overshoot voltage value and an undershoot voltage value of the power module are normal based on the power-on waveforms and the power-off waveforms of the four channels of signals of the power module stored by the load meter under the no-load state and the full-load state.

Finally, it should be noted that in the present application, relational terms, e.g., first and second, are only used to distinguish one object or operation from another object or operation, and do not necessarily require or imply any actual relationship or sequence between these objects or operations. What is more, the terms "include", "comprise" or any other variants thereof are intended to cover non-exclusive inclusion, so that a process, method, object or device including series of elements not only includes those elements, but also includes other elements that are not explicitly listed, or also include elements that are inherent to the process, method, object or device. If there are no more restrictions, the elements defined by the sentence "including a . . . " does not exclude the existence of other elements in the process, method, object or device including the same element.

The various embodiments in the present specification are described in a progressive way, and each embodiment focuses on the differences from other embodiments, so the same or similar parts between the various embodiments can be referred to each other.

The above description of the disclosed embodiments enables those skilled in the art to implement or use the present application. Various modifications to these embodiments will be obvious to those skilled in the art, and the general principles defined by the document can be implemented in other embodiments without departing from the spirit or scope of the present application. Therefore, the present application will not be limited to the embodiments shown in the present application, but should conform to the widest scope consistent with the principles and novel features disclosed in the present application.

The invention claimed is:

1. A method for testing a power module, the power module is located in a testing motherboard, the method comprising:
    connecting both ends of an output capacitor of the power module to a load meter, respectively;
    inputting an input signal of the power module to a first channel of an oscillometer, inputting an enable signal of the power module to a second channel of the oscillometer, inputting a PowerGood signal of the power module to a third channel of the oscillometer, and inputting an output signal of the power module to a fourth channel of the oscillometer;
    setting testing items of the first, second and third channels of the oscillometer as Max, and setting testing items of the fourth channel of the oscillometer as Max/Min/Pk-Pk/Rise/Fall;
    controlling the load meter to be powered on and setting the load meter to a static load mode;
    adjusting the load meter to a no-load state, adjusting the oscillometer to be triggered by rising edges of the enable signal, controlling the testing motherboard to be powered on, capturing and storing power-on waveforms of the input signal, the enable signal, the PowerGood signal and the output signal of the power module at the no-load state, adjusting the oscillometer to be triggered by falling edges of the enable signal, controlling the testing motherboard to be powered off, and capturing and storing power-off waveforms of the input signal, the enable signal, the PowerGood signal and the output signal of the power module at the no-load state;
    determining, by a tester, whether a power-on sequence and a power-off sequence of the power module are normal and determining whether an overshoot voltage value and an undershoot voltage value of the power module are normal based on the power-on waveforms and the power-off waveforms of the four channels signals of the power module stored by the load meter under the no-load state;
    adjusting the load meter to a full-load state, adjusting the oscillometer to be triggered by the rising edges of the enable signal, controlling the testing motherboard to be powered on, capturing and storing power-on waveforms of the input signal, the enable signal, the PowerGood signal and the output signal of the power module at the full-load state, adjusting the oscillometer to be triggered by the falling edges of the enable signal, controlling the testing motherboard to be powered off, and capturing and storing power-off waveforms of the input signal, the enable signal, the PowerGood signal and the output signal of the power module at the full-load state; and
    determining, by a tester, whether the power-on sequence and power-off sequence of the power module are normal and determining whether the overshoot voltage value and undershoot voltage value of the power module are normal based on the power-on waveforms and the power-off waveforms of the four channels of signals of the power module stored by the load meter under the full-load state.

2. The method claim 1, further comprising:
    adjusting the load meter to a half-load state, adjusting the oscillometer to be triggered by the rising edges of the enable signal, controlling the testing motherboard to be powered on, capturing and storing power-on waveforms of the input signal, the enable signal, the PowerGood signal and the output signal of the power module at the half-load state, adjusting the oscillometer to be triggered by the falling edges of the enable signal, controlling the testing motherboard to be powered off, and capturing and storing power-off waveforms of the input signal, the enable signal, the PowerGood signal and the output signal of the power module at the half-load state; and
    determining, by a tester, whether a power-on sequence and a power-off sequence of the power module are normal and determining whether the overshoot voltage value and undershoot voltage value of the power module are normal based on the power-on waveforms and the power-off waveforms of the four channels of signals of the power module stored by the load meter under the half-load state.

3. The method of claim 2, further comprising:
    determining whether a rising time and a falling time of the output signal of the power module meet preset requirements based on the power-on waveforms and the power-off waveforms of the output signal of the power module stored by the load meter under the no-load state;
    and/or, determining whether a rising time and a falling time of the output signal of the power module meet preset requirements based on the power-on waveforms and the power-off waveforms of the output signal of the power module stored by the load meter under the full-load state;
    and/or, determining whether a rising time and a falling time of the output signal of the power module meet preset requirements based on the power-on waveforms and the power-off waveforms of the output signal of the power module stored by the load meter under the half-load state.

4. The method of claim 2, further comprising:
    comparing a rising time and a falling time of the output signal of the power module with a preset rising time threshold to determine whether the rising time of the output signal of the power module meets the preset requirements under the half-load state; and
    comparing a falling time of the output signal of the power module with a preset falling time threshold to determine whether the falling time of the output signal of the power module meets the preset requirements at the half-load state.

5. The method of claim 1, wherein inputting an input signal of the power module to a first channel of an oscillometer, inputting an enable signal of the power module to a second channel of the oscillometer, inputting a PowerGood signal of the power module to a third channel of the oscillometer, and inputting an output signal of the power module to a fourth channel of the oscillometer further includes:
    connecting an input end of the power module to the first channel of the oscillometer through a first single-ended probe;

connecting an enable signal end of the power module to the second channel of the oscillometer through a second single-ended probe;
connecting a PowerGood signal end of the power module to the third channel of the oscillometer through a third single-ended probe; and
connecting an output end of the power module to the fourth channel of the oscillometer through a fourth single-ended probe.

6. The method of claim 1, wherein inputting an input signal of the power module to a first channel of an oscillometer, inputting an enable signal of the power module to a second channel of the oscillometer, inputting a PowerGood signal of the power module to a third channel of the oscillometer, and inputting an output signal of the power module to a fourth channel of the oscillometer further includes:
connecting an input end of the power module to the first channel of the oscillometer through a first single-ended probe;
connecting an enable signal end of the power module to the second channel of the oscillometer through a second single-ended probe;
connecting an PowerGood signal end of the power module to the third channel of the oscillometer through a third single-ended probe; and
connecting one end of the output capacitor of the power module to a positive input end of a differential probe, connecting the other end of the output capacitor of the power module to a negative input end of the differential probe, and connecting an output end of the differential probe to the fourth channel of the oscillometer.

7. The method of claim 1, further comprising:
comparing a rising time of the output signal of the power module with a preset rising time threshold to determine whether the rising time of the output signal of the power module meets preset requirements under the no-load state;
comparing a falling time of the output signal of the power module with a preset falling time threshold to determine whether the falling time of the output signal of the power module meets preset requirements at the no-load state;
a rising time of the output signal of the power module with a preset rising time threshold to determine whether the rising time of the output signal of the power module meets preset requirements under the full-load state; and
comparing a falling time of the output signal of the power module with a preset falling time threshold to determine whether the falling time of the output signal of the power module meets the preset requirements at the full-load state.

8. A method for testing a power module located in a testing motherboard, the method comprising:
connecting both ends of an output capacitor of the power module to a load meter, respectively;
inputting an input signal of the power module to a first channel of an oscillometer, inputting an enable signal of the power module to a second channel of the oscillometer, inputting a PowerGood signal of the power module to a third channel of the oscillometer, and inputting an output signal of the power module to a fourth channel of the oscillometer;
setting testing items of the first, second and third channels of the oscillometer as Max, and setting testing items of the fourth channel of the oscillometer as Max/Min/Pk-Pk/Rise/Fall;
controlling the load meter to be powered on and setting the load meter to a static load mode;
adjusting the load meter to a no-load state, adjusting the oscillometer to be triggered by rising edges of the enable signal, controlling the testing motherboard to be powered on, capturing and storing power-on waveforms of the input signal, the enable signal, the PowerGood signal and the output signal of the power module at the no-load state, adjusting the oscillometer to be triggered by falling edges of the enable signal, controlling the testing motherboard to be powered off, and capturing and storing power-off waveforms of the input signal, the enable signal, the PowerGood signal and the output signal of the power module at the no-load state; and
determining, by a tester, whether a power-on sequence and a power-off sequence of the power module are normal and determining whether an overshoot voltage value and an undershoot voltage value of the power module are normal based on the power-on waveforms and the power-off waveforms of the four channels of signals of the power module stored by the load meter under the no-load state.

9. The method of claim 8, further comprising:
adjusting the load meter to a full-load state, adjusting the oscillometer to be triggered by the rising edges of the enable signal, controlling the testing motherboard to be powered on, capturing and storing power-on waveforms of the input signal, the enable signal, the PowerGood signal and the output signal of the power module at the full-load state, adjusting the oscillometer to be triggered by the falling edges of the enable signal, controlling the testing motherboard to be powered off, and capturing and storing power-off waveforms of the input signal, the enable signal, the PowerGood signal and the output signal of the power module at the full-load state; and
determining, by a tester, whether the power-on sequence and power-off sequence of the power module are normal and determining whether the overshoot voltage value and undershoot voltage value of the power module are normal based on the power-on waveforms and the power-off waveforms of the four channels of signals of the power module stored by the load meter under the full-load state.

10. The method of claim 9, further comprising:
determining whether a rising time and a falling time of the output signal of the power module meet preset requirements based on the power-on waveforms and the power-off waveforms of the output signal of the power module stored by the load meter under the full-load state.

11. The method for testing of claim 9, further comprising:
comparing a rising time of the output signal of the power module with a preset rising time threshold to determine whether the rising time of the output signal of the power module meets preset requirements under the no-load state;
comparing a falling time of the output signal of the power module with a preset falling time threshold to determine whether the falling time of the output signal of the power module meets preset requirements at the no-load state;
comparing a rising time of the output signal of the power module with a preset rising time threshold to determine whether the rising time of the output signal of the power module meets preset requirements under the full-load state; and comparing a falling time of the output signal of the power module with a preset falling time threshold to determine whether the falling time of the output signal of the power module meets preset requirements at the full-load state.

12. The method of claim 9, further comprising:

adjusting the load meter to a half-load state, adjusting the oscillometer to be triggered by the rising edges of the enable signal, controlling the testing motherboard to be powered on, capturing and storing power-on waveforms of the input signal, the enable signal, the PowerGood signal and the output signal of the power module at the half-load state, adjusting the oscillometer to be triggered by the falling edges of the enable signal, controlling the testing motherboard to be powered off, and capturing and storing power-off waveforms of the input signal, the enable signal, the PowerGood signal and the output signal of the power module at the half-load state.

13. The method of claim 12, further comprising:

determining whether a rising time of the output signal of the power module meet preset requirements based on the power-on waveforms and the power-off waveforms of the output signal of the power module stored by the load meter under the half-load state;

determining whether a power-on sequence and a power-off sequence of the power module are normal and determining whether the overshoot voltage value and undershoot voltage value of the power module are normal based on the power-on waveforms and the power-off waveforms of the four channels of signals of the power module stored by the load meter under the half-load state.

14. The method of claim 8, further comprising:

determining whether a rising time and a falling time of the output signal of the power module meet preset requirements based on the power-on waveforms and the power-off waveforms of the output signal of the power module stored by the load meter under the no-load state.

15. A method for testing a power module located in a testing motherboard, the method comprising:

connecting both ends of an output capacitor of the power module to a load meter, respectively;

inputting an input signal of the power module to a first channel of an oscillometer, inputting an enable signal of the power module to a second channel of the oscillometer, inputting a PowerGood signal of the power module to a third channel of the oscillometer, and inputting an output signal of the power module to a fourth channel of the oscillometer;

adjusting the load meter to a no-load state, capturing and storing power-on waveforms of the input signal, the enable signal, the PowerGood signal and the output signal of the power module at the no-load state;

adjusting the load meter to a full-load state, capturing and storing power-on waveforms of the input signal, the enable signal, the PowerGood signal and the output signal of the power module at the full-load state; and determining, by a tester, whether a power-on sequence and a power-off sequence of the power module are normal and determining whether an overshoot voltage value and an undershoot voltage value of the power module are normal based on the power-on waveforms and power-off waveforms of the four channels of signals of the power module stored by the load meter under the no-load state and the full-load state.

* * * * *